United States Patent
Kramer et al.

(10) Patent No.: US 7,154,339 B2
(45) Date of Patent: Dec. 26, 2006

(54) RF POWER AMPLIFIER

(75) Inventors: Niels Kramer, Nijmegen (NL); Ronald Koster, Nijmegen (NL); Rob Mathijs Heeres, Nijmegen (NL); John Joseph Hug, Nijmegen (NL)

(73) Assignee: NXP B.V., Eindhoven (NL)

( * ) Notice: Subject to any disclaimer, the term of this patent is extended or adjusted under 35 U.S.C. 154(b) by 160 days.

(21) Appl. No.: 10/514,900

(22) PCT Filed: May 19, 2003

(86) PCT No.: PCT/IB03/02232

§ 371 (c)(1),
(2), (4) Date: Nov. 17, 2004

(87) PCT Pub. No.: WO03/098795

PCT Pub. Date: Nov. 27, 2003

(65) Prior Publication Data

US 2005/0253656 A1    Nov. 17, 2005

(30) Foreign Application Priority Data

May 22, 2002   (EP) .................................. 02076997

(51) Int. Cl.
*H03F 3/68* (2006.01)

(52) U.S. Cl. .................................................... 330/295
(58) Field of Classification Search ................ 330/295, 330/302
See application file for complete search history.

(56) References Cited

U.S. PATENT DOCUMENTS

| 5,276,406 A | * | 1/1994 | Samay et al. | ................ 330/277 |
| 5,629,648 A | | 5/1997 | Pratt | ........................ 330/289 |

* cited by examiner

*Primary Examiner*—Steven J. Mottola
(74) *Attorney, Agent, or Firm*—Peter Zawilski

(57) ABSTRACT

An RF power amplifier according to the invention comprises a plurality of parallel output transistors (HBT,1,1 to HBT,1,N) connected to a power supply. A plurality of base resistors (Rb,1,1 to Rb,1,N) for the output transistors (HBT,1,1 to HBT,1,N) and a plurality of input capacitors (Cb,1 to Cb,N), each coupled in parallel to receive an RF signal input and connected via at least one additional passive component to the inputs of each corresponding output transistor (HBT,1,1 to HBT,1,N), are provided An output for an RF output signal is obtained from the parallel connection of the output transistors (HBT,1,1 to HBT,1,N). The transistors (HBT,1,1 to HBT,1,N) are heterojunction bipolar transistors.

5 Claims, 4 Drawing Sheets

RF POWER AMPLIFIER

The invention relates to a radio frequency power amplifier comprising a plurality of amplifying elements each with a control electrode, a first main electrode, and a second main electrode, whereby the first main electrodes of the amplifying elements are coupled to a common output node, the second main electrodes of the amplifying elements are coupled to a common reference node, the control electrode of each of the amplifying elements is coupled to a common radio frequency signal input node via a respective input capacitor and to a common bias node via a respective base resistor.

U.S. Pat. No. 5,629,648 discloses a radio frequency (RF) power amplifier circuit comprising heterojunction bipolar transistors and including a first transistor having a base-emitter voltage; a power supply and a power supply resistor connected to the power supply, causing a DC current to flow through the first transistor which develops a resultant voltage equal to the base-emitter voltage of the first transistor. At least two manifold base resistors and at least two output transistors are provided, each of which receives the resultant voltage through its corresponding manifold base resistor. At least two input capacitors, each coupled in parallel to receive the RF signal input and connected to the input of each corresponding output transistor, have a common input connected to the RF signal input and have individual outputs that are DC isolated from each other and are connected to each output transistor. An RF output signal is obtained from the parallel connection of the output transistors, provided that each transistor is connected to ground.

Heterojunction bipolar transistors are suitable for radio frequency (RF) power amplifier applications. Generally speaking, a lot of power is dissipated in a power device. In order to spread the heat sufficiently, thus avoiding constructive breakdown, such power amplifiers are typically made by distributing many small output transistor cells evenly over a large semiconductor area. All cells are fabricated on a piece of semiconductor material (Si or GaAs) and are connected in such a way that they operate in parallel. In this way many small devices can generate a high power level. Two well known problems of such amplifiers are their electrical stability and linearity.

It is an object of the invention to provide a transistor RF power amplifier having an improved stability.

To this end the invention provides a radio frequency power amplifier as defined in the opening paragraph which is characterized in that the control electrode of each of the amplifying elements is coupled to said respective capacitor ($Cb,1 \ldots Cb,N$) and to said respective base resistor ($Rb,1,1 \ldots Rb,1,N$) via a respective additional passive component ($Rb,2,1 \ldots Rb,2,N$).

A further advantage of the RF power amplifier according to the invention is an improved linearity.

Additional advantageous features of the radio frequency power amplifier according to the invention are claimed in the dependent claims.

These and various other advantages and features of novelty which characterize the present invention are disclosed in detail in the appended claims. However, for a better understanding of the invention, its advantages, and the object achieved by its use, reference is made to the drawings which also form part hereof, and to the accompanying description, illustrating preferred embodiments of the present invention, with reference to the drawings, in which:

Figure 1:
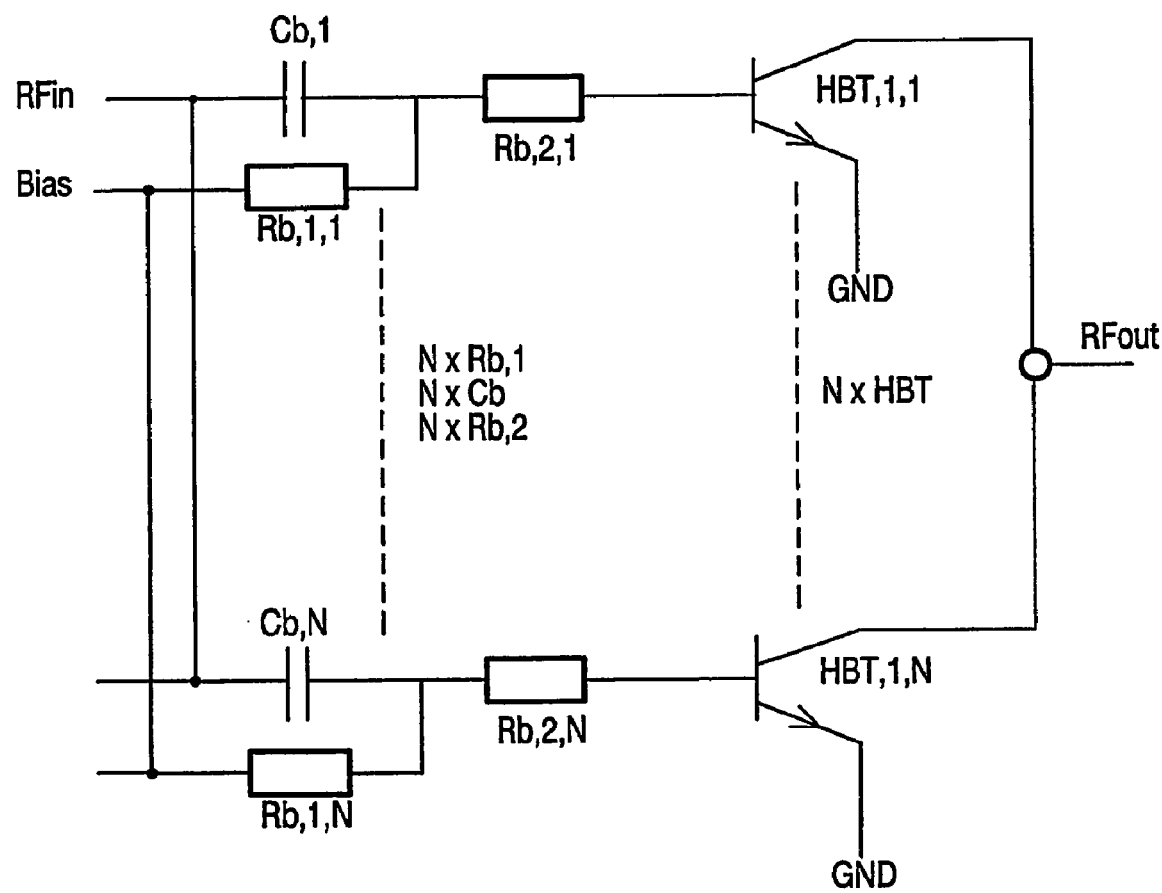
FIG. 1 shows an RF power amplifier circuit according to an embodiment of the invention.

FIG. 1 shows an RF power amplifier circuit comprising heterojunction bipolar output transistors $HBT,1,1$ to $HBT,1,N$, the base terminals of which are connected to base resistors $Rb,1,1$ to $Rb,1,N$ which in turn are connected to the power supply at a Bias terminal. Input capacitors $Cb,1$ to $Cb,N$ are each coupled in parallel to receive the RF signal input and are connected, via additional resistors $Rb,2,1$ to $Rb,2,N$ to the individual input of each corresponding output transistor $HBT,1,1$ to $HBT,1,N$. The input capacitors $Cb,1$ to $Cb,N$ have one terminal connected to the RF signal input terminal Rfin. The other terminals of the input capacitors $Cb,1$ to $Cb,N$ are DC isolated from each other and are connected, via the additional resistors $Rb,2,1$ to $Rb,2,N$, to the individual output transistors $HBT,1,1$ to $HBT,1,N$. An RF output signal is obtained from the parallel connection of the output transistors $HBT,1,1$ to $HBT,1,N$.

The addition of the resistors $Rb,2,1$ to $Rb,2,N$ has a positive effect on the stability of the whole circuit. In order to calculate the effect on the stability, the so-called stability K-factor is calculated, as indicated schematically in FIG. 2, for a heterojunction bipolar transistor RF power amplifier consisting of 24 cells (N=24), each cell having an $Rb,1$ an $Rb,2$ and a $Cb$.

Figure 2:
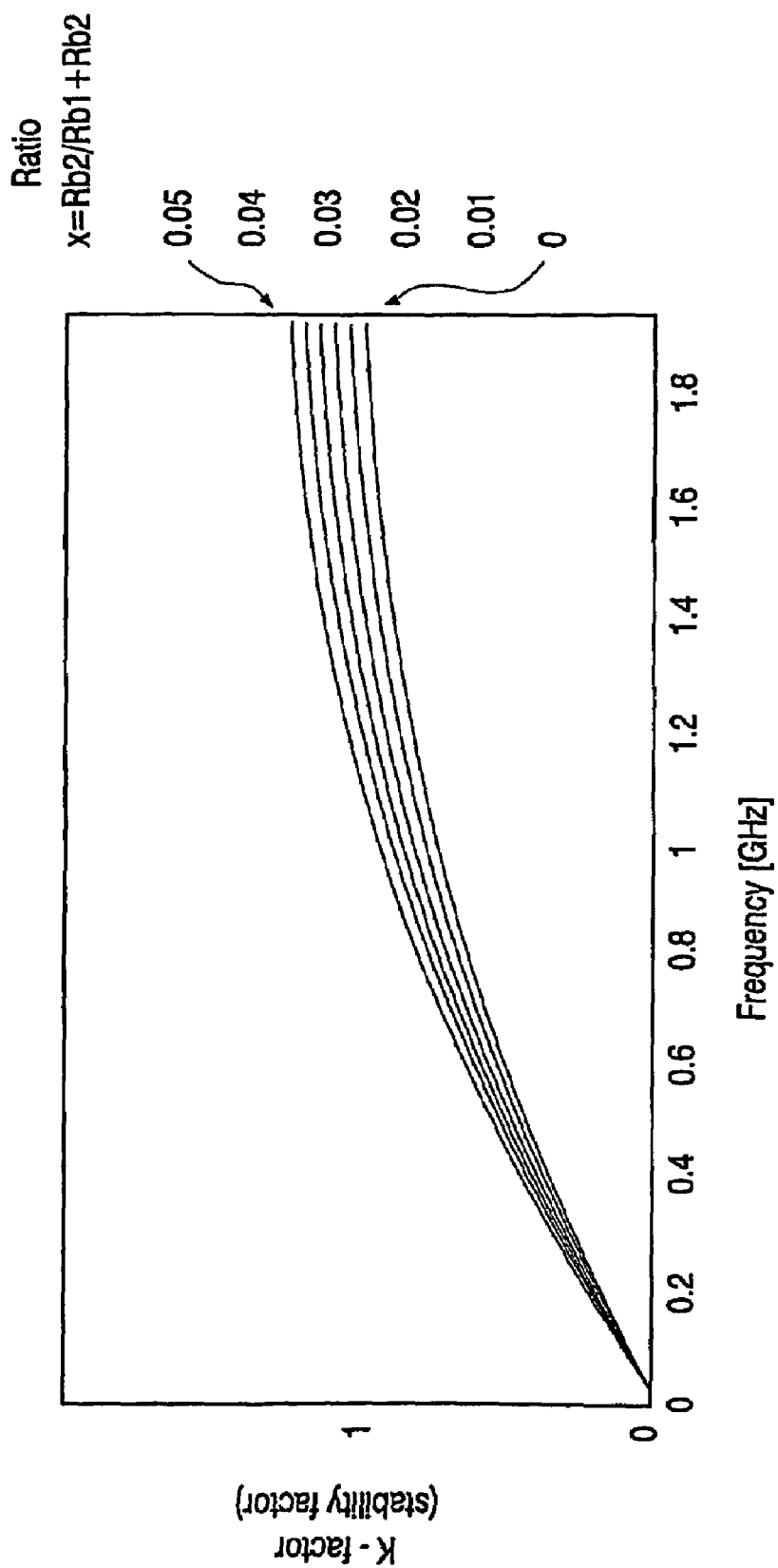
FIG. 2 shows a graph demonstrating the positive effect of the additional resistor on the stability of the RF power amplifier circuit of FIG. 1.

In order to assess the influence of the additional resistor on stability, the following simulation was carried out. The ratio of $Rb,2/Rb,1+Rb,2$ was varied while keeping the sum $Rb,1+Rb,2$ constant. The sum $Rb,1+Rb,2$ is kept constant in order to maintain the same temperature stability. FIG. 2 shows a graph of the K-factor versus frequency, where the parameter x was varied from 0 to 0.05, the intermediate values being x=0.01, x=0.02, x=0.03, and x=0.04. The effect of the resistor $Rb,2$ on the stability is thus demonstrated.

Figure 3:
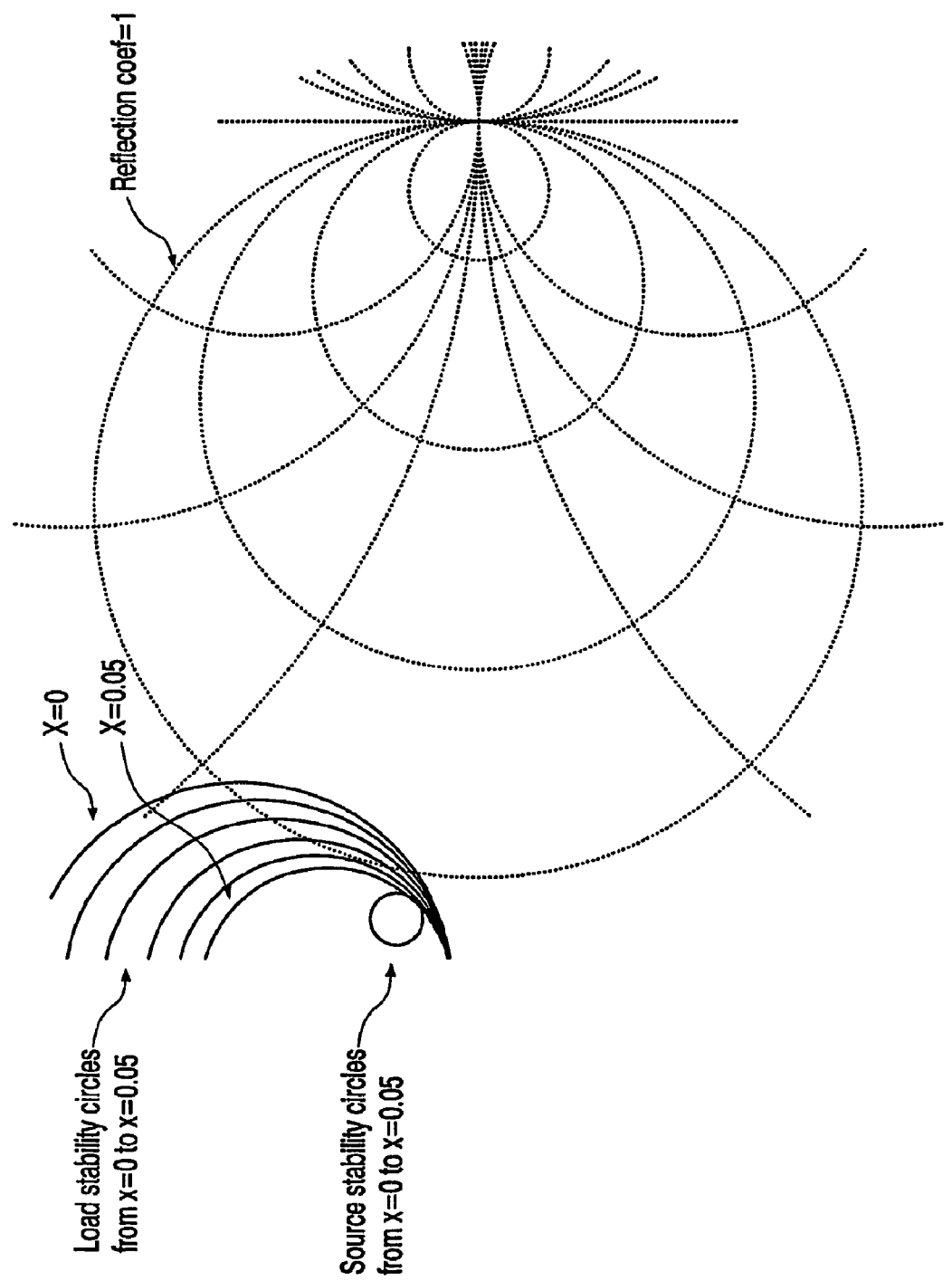
FIG. 3 shows a Smith chart with stability circles, also demonstrating the positive effect of the additional resistor on the stability of the RF power amplifier circuit of FIG. 1.

When increasing the value of $Rb,2$, the frequency at which the K-factor is 1 drops. If the K-factor is above 1, the device is stable. So by adding $Rb,2$ and by increasing its value, the device becomes more stable. This is demonstrated by the stability circles of FIG. 3 which shows a Smith chart with stability circles showing the benefit of adding the resistor $Rb,2$. In connection with the load stability circles, the parameter x was varied from 0 to 0.05, the intermediate values being x=0.01, x=0.02, x=0.03, and x=0.04. In connection with the source stability circles, the parameter x was varied from 0 to 0.05, the intermediate values being x=0.01, x=0.02, x=0.03, and x=0.04. Increasing the value of $Rb,2$ makes the stability circles smaller, indicating that the device becomes less sensitive to input impedance variations which have an adverse effect on the stability.

The addition of the resistor $Rb,2$ in the circuit has an effect on other electrical parameters, most noticeably the electrical gain and the power added efficiency. In order to estimate a good trade-off between improved stability and linearity the gain and power added efficiency was calculated as a function of the value of $Rb,2$ with respect to $Rb,1$. This simulation was done for two power devices that can generate power levels that are typically used in GSM and DCS mobile phones.

Figure 4:
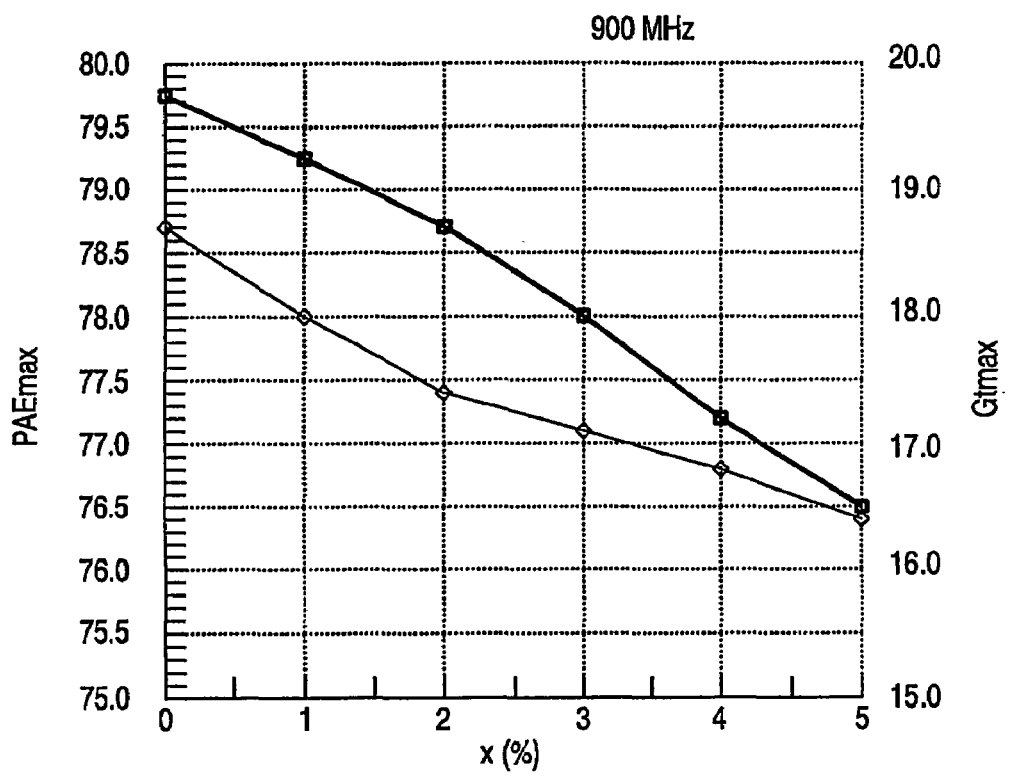
FIG. 4 shows the effect of the value of $Rb,2$ on the electrical gain and power added efficiency at the 900 MHz frequency band.
Figure 5:
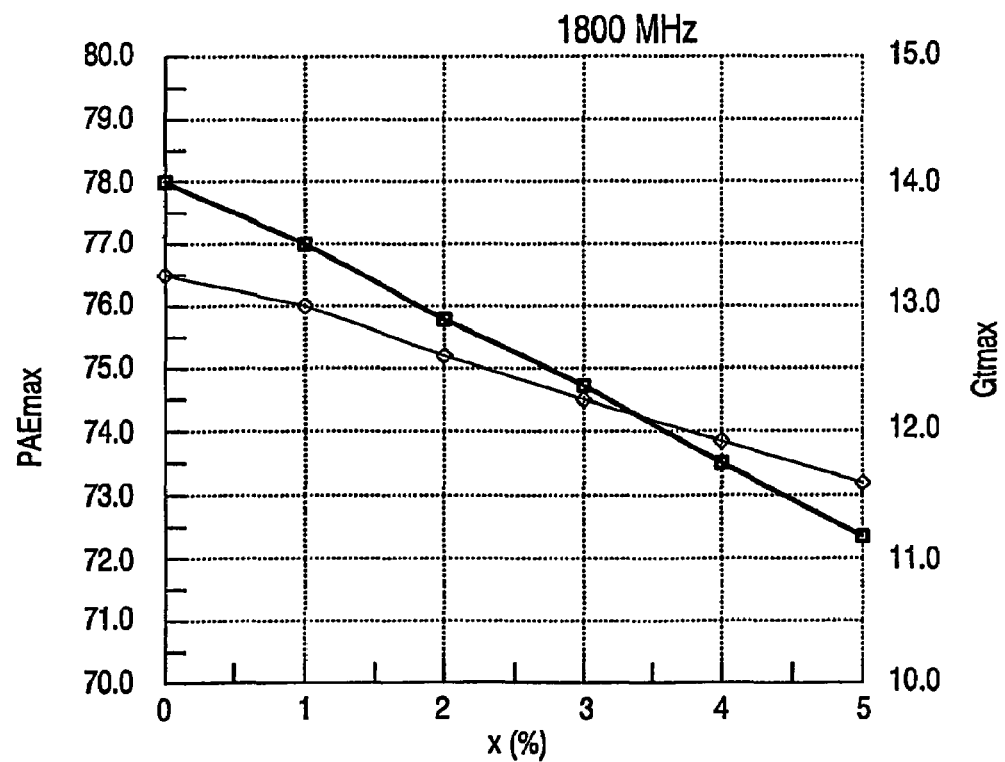
FIG. 5 shows the effect of the value of $Rb,2$ on the electrical gain and power added efficiency at the 1800 MHz frequency band.

FIGS. 4 and 5 show the effect of the value of Rb,2 on the electrical gain and power added efficiency in the 900 MHz and the 1800 MHz frequency bands. It is apparent from these Figures that the effect on the electrical gain and power added efficiency is low if the value of the resistor Rb,2 is low. Hence, the addition of the resistor Rb,2 offers an improvement as regards stability and allows an additional degree of freedom in designing an RF power amplifier using heterojunction bipolar transistor technology.

Further improvements to optimize the trade-off between stability and linearity on the one hand and electrical gain and power added efficiency on the other hand can be achieved by adding additional passive resistive components in parallel and/or in series with resistor Rb,2 or by adding additional passive capacitive components in parallel with resistor Rb,2.

The embodiments of the present invention described herein are intended to be taken in an illustrative and not a limiting sense. Various modifications may be made to these embodiments by persons skilled in the art without departing from the scope of the present invention as defined in the appended claims.

The invention claimed is:

1. A radio frequency power amplifier comprising a plurality of bipolar amplifying elements each with a control electrode, a first main electrode, and a second main electrode, whereby the first main electrodes of the amplifying elements are coupled to a common output node, the second main electrodes of the amplifying elements are coupled to a common reference node, the control electrode of each of the amplifying elements is coupled to a common radio frequency signal input node via a respective input capacitor and to a common bias node via a respective base resistor, characterized in that the control electrode of each of the amplifying elements is coupled to said respective capacitor and to said respective base resistor via a respective additional passive component.

2. A radio frequency power amplifier comprising a plurality of amplifying elements each with a control electrode, a first main electrode, and a second main electrode, whereby the first main electrodes of the amplifying elements are coupled to a common output node, the second main electrodes of the amplifying elements are coupled to a common reference node, the control electrode of each of the amplifying elements is coupled to a common radio frequency signal input node via a respective input capacitor and to a common bias node via a respective base resistor, characterized in that the control electrode of each of the amplifying elements is coupled to said respective capacitor and to said respective base resistor via a respective additional passive component, characterized in that the additional passive component is a resistor.

3. A radio frequency power amplifier as claimed in claim 2, characterized in that the additional resistor has an impedance that is small with respect to the impedance of the corresponding base resistor.

4. A radio frequency power amplifier as claimed in claim 2, characterized in that further additional passive components are provided in parallel and/or in series with the additional resistor.

5. A radio frequency power amplifier, comprising a plurality of amplifying elements each with a control electrode, a first main electrode, and a second main electrode, whereby the first main electrodes of the amplifying elements are coupled to a common output node, the second main electrodes of the amplifying elements are coupled to a common reference node, the control electrode of each of the amplifying elements is coupled to a common radio frequency signal input node via a respective input capacitor and to a common bias node via a respective base resistor, characterized in that the control electrode of each of the amplifying elements is coupled to said respective capacitor and to said respective base resistor via a respective additional passive component, characterized in that the amplifying elements are heterojunction bipolar transistors.

* * * * *